United States Patent [19]

Reda et al.

[11] 3,768,134

[45] Oct. 30, 1973

[54] SUBSTRATE PINNING

[75] Inventors: Anthony F. Reda, Yorktown Heights; James D. Wharmby, Poughkeepsie, both of N.Y.

[73] Assignee: Cogar Corporation, Wappingers Falls, N.Y.

[22] Filed: Jan. 11, 1971

[21] Appl. No.: 105,491

[52] U.S. Cl. ............ 29/203 B, 29/33 M, 29/203 S, 29/630 D

[51] Int. Cl. ............ H01r 9/00

[58] Field of Search ............ 29/630 D, 203 S, 29/203 B, 203 P, 33 M, 33 J

[56] References Cited

UNITED STATES PATENTS

| | | | |
|---|---|---|---|
| 3,139,665 | 7/1964 | Wardell | 29/33.10 |
| 3,257,708 | 6/1966 | Stricker | 29/203 B X |
| 3,537,162 | 11/1970 | Kochan | 29/33 M |
| 3,570,099 | 3/1971 | Ackerman et al. | 29/203 B |
| 3,276,854 | 10/1966 | Felker et al. | 29/203 B X |

FOREIGN PATENTS OR APPLICATIONS

| | | | |
|---|---|---|---|
| 845,314 | 10/1958 | Great Britain | 29/622 |

*Primary Examiner*—Richard J. Herbst
*Assistant Examiner*—Joseph A. Walkowski
*Attorney*—Harry M. Weiss

[57] ABSTRACT

Apparatus for providing electrical circuit components with terminal pins firmly secured to the component substrate. Both method and apparatus are provided serving to automatically position a terminal pin with respect to the substrate, and to form a head on the pin on one surface of the substrate, and a bulge on the pin adjacent the opposite surface of the substrate from the head to secure the pin with respect to the substrate without damaging the substrate.

15 Claims, 9 Drawing Figures

PATENTED OCT 30 1973 3,768,134

SHEET 1 OF 7

INVENTORS
ANTHONY F. REDA
JAMES D. WHARMBY

BY Robert W. Fiddler
Harry M Weiss
ATTORNEYS

SUBSTRATE PINNING

BACKGROUND OF THE INVENTION

This invention relates to the art of electrical circuit component manufacture, and more particularly to improved means, including both method and apparatus for automatically securing contact or terminal pins to a circuit component.

With increased miniaturization of electronic circuit components, and the evolution of increasingly sophisticated microelectronics technology, a variety of circuit components have been evolved all supported on a single substrate. Connections to this substrate are made by means of terminal or connector pins embedded in the substrate, and electrically connected to the circuits formed on or carried by the substrate.

Efficient and economic circuit component production dictates that the securement of the pins to the substrate be made automatic where possible, minimizing required manual labor, and permitting an increase in the speed of production. To this end, a variety of apparatus has been evolved for positioning the necessary terminal pins in apertures in the circuit component substrate, and thereafter securing the pins to the substrate. Securement is generally effected by upsetting a head on the pins which have been inserted through the substrate, on an end of the pins extending over one of the surfaces of the substrate, and forming a bulge on a portion of the pin extending from the opposite face of the substrate, with a corresponding upset of the pin material within the substrate to effect a tight connection.

The alignment of the pin with the substrate aperture, and the upsetting of the pin with respect to the substrate presents a number of problems, in that improper alignment often results in damage to the pin handling equipment, as well as to the substrate, and previously used pin upsetting equipment has resulted in an unusually high rate of damage to the substrates, seriously interfering with desired efficiency and quality of production.

SUMMARY OF THE INVENTION

It is with the above problems and considerations in mind, that the present improved apparatus and method has been evolved for securing a conductor or terminal pin to an electric circuit component substrate in an automatic fashion in which positioning of the pin with respect to the substrate is facilitated, and not made critical so that any misalignment does not result in damage to the equipment or substrate; and further securement of the pin to the substrate by upsetting the material of the pin with respect to the substrate produces minimal damage of the substrate during a normal production run.

It is accordingly among the objects of this invention to provide an improved method of applying conductor pins to a substrate, and an apparatus implementing the practice of the method.

A further object of the invention is to provide an improved method and apparatus for pinning substrates, minimizing likelihood of damage to the substrate during the pinning operation.

Another object of the invention is to provide an improved substrate pinning apparatus adapted for automatic, rapid operation.

A further object of the invention is to provide an improved substrate pinning apparatus in which the quality of the pinning operation may be monitored.

These and other objects of the invention which will become hereafter apparent are achieved by orienting an array of pins in a position such as they will appear in the pinned substrate. Thereafter a substrate having apertures therethrough corresponding to the array of pins is positioned over the array of pins, with the head of the pins at or slightly inserted into the bottom of the apertures in the lower face of the substrate. Both the lower and upper faces of the substrate are free, and light may pass through any substrate openings not obstructed by a pin, thus indicating whether the pinning operation is being properly performed. The pins are then driven through the substrate, with the ends of the pins adjacent the substrate prior to entry, free of lateral restraint so that any slight misalignment between the pins and the substrate openings can be accommodated by deflection of the unrestrained pin portion. The pins are driven through the substrate a distance such that the entry end of the pins extends from one side of the substrate. Thereafter, heading of the pins is accomplished by exerting pressure on the ends of the pins extending through the substrate, while the other ends of the pins on the opposite side of the substrate are securely held so that the pressure exerted on the extending ends of the pins upset the pins to form the desired heads on the portions of the pins extending through the substrate. During heading, the portions of the pins extending from beneath the lower surface of the substrate are securely laterally restrained along their outer surfaces so that maximum upsetting forces are accommodated in the unrestrained portions of the pins extending above the upper surface of the substrate. Simultaneously, the lower surface of the substrate is supported adjacent the pins to minimize flexing of the substrate during heading.

Thereafter bulging is accomplished by releasing a portion of the pins extending beneath the substrate from restraint along their lateral surfaces, and applying pressure to the upper ends of the pins, and the unrestrained portion of the pin beneath the substrate is upset to provide the desired bulge beneath the substrate. The substrate is thus formed with a pin headed on one surface of the substrate and bulged at the other substrate surface securely maintaining the pin in desired position, and the pinned substrate is ready for use.

An apparatus implementing the automatic performance of the above described method is provided in which a nest assembly is arranged for stepped rotation on a six station dial. The nest assembly is formed with a pin orienting nest maintaining desired pins in the desired array corresponding to the orientation of the pin receiving openings in the substrate. Substrate engaging grippers are movably mounted to engage a substrate in desired orientation above the pin nest with the openings in the substrate aligned with the array of pins held by the nest. Pin punches are mounted beneath the pin nest to move into the pin retaining guides of the nest with the punches forcing the pins upwardly into the substrate. A punch plunger is reciprocably mounted beneath the pin punches to exert desired pressure on the pin punches, and a punch guide supports the pin nest for desired relative movement with respect to the substrate.

At the first station, the required pins are inserted into the nest which maintains the required pins in a desired array corresponding to the desired positioning of the pins in the substrate.

At the second station, to which the pin filled nest is moved on the dial, a substrate is positioned over the nest, with the substrate openings aligned with the pin array.

At the third station to which the pin filled nest with the substrate securely engaged thereover is moved as the dial is rotated, the substrate may be inspected to determine that the requisite pins are in desired position with respect to the substrate openings.

From this inspection station, the pin filled nest carrying the gripped substrate is moved by rotation of the dial to a heading station, where the nest is brought up to securely engage the bottom of the substrate, with the pins inserted into the substrate extending slightly thereabove. A ram at this heading station comes down on the exposed free ends of the pins, and upsets them to form the desired heads on the pins.

Thereafter, the substrate with the headed pins is moved by the dial to a bulging station, at which the nest moves down with respect to the bottom of the substrate so as to leave a portion of the pins laterally unconstrained beneath the substrate. A ram at this bulging station exerts pressure on the pins upsetting the unrestrained portion of the pins beneath the substrate to form desired bulges.

Thereafter the headed and bulged pinned substrate is moved on the dial to an ejection station, where the substrate is released and the pin punches are moved up to eject the pins from the nest, thus ejecting the pinned substrate for removal.

A feature of the invention resides in the method of insertion of the pins into the substrate without lateral restraint on the entry ends of the pins so that they may be deflected without damage to the substrate. The apparatus provides for pin insertion with the pin retaining nest spaced from the lower surface of the substrate to provide this deflection clearance for the pins being inserted into the substrate.

Another feature of the invention resides in the fact that the substrate is maintained in a relatively fixed position with respect to the dial throughout the pinning operation, thus minimizing likelihood of substrate damage.

A further feature of the invention resides in the method and apparatus provided for separately heading and bulging the pins. Thus during the heading operation, the substrate is completely supported, while during the bulging operation which takes place after the pins have been strain hardened by the heading operation, the bulging forces are resisted by the already strengthened headed pin.

BRIEF DESCRIPTION OF THE DRAWINGS

The specific details of a preferred embodiment of the invention, and their mode of functioning will be particularly pointed out and distinctly claimed in clear, concise, and exact terms in conjunction with the accompanying drawings, wherein:

DESCRIPTION OF PREFERRED EMBODIMENT OF THE INVENTION

Referring now more particularly to the drawings, like numerals in the various figures will be employed to designate like parts.

Figure 1:
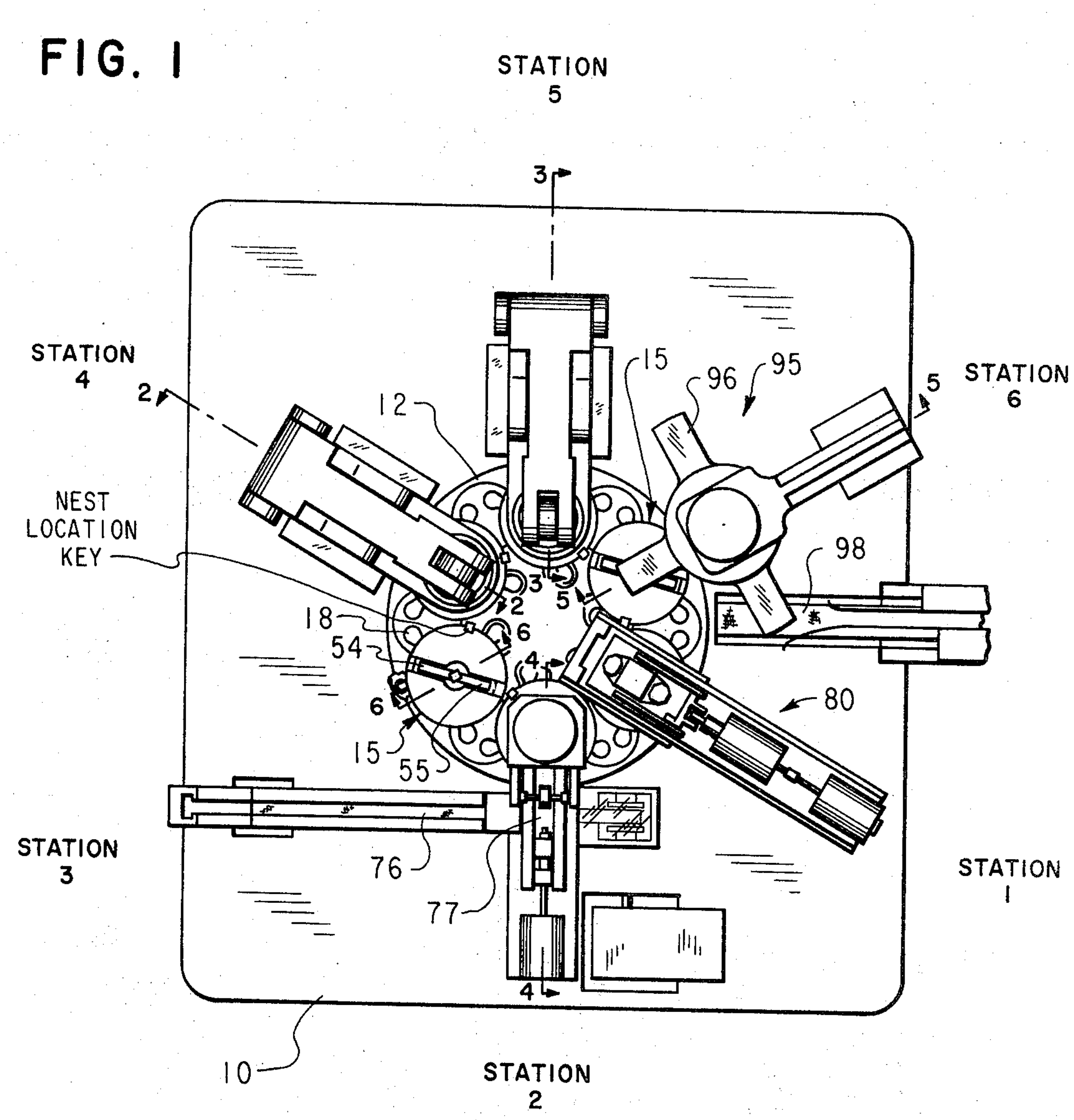
FIG. 1 is a top plan view looking down at a six station index unit suitable for automatically forming pinned substrates in accordance with the teachings of this invention.

An automatic substrate pinning machine made in accordance with the teachings of this invention, is illustratively shown in FIG. 1 to comprise a six station index unit 10, having a rotatable dial 12 mounted for rotation at the center of the index unit. The dial 12 is formed with six circular openings each accommodating a nest assembly 15. The dial is driven for stepped rotation so that the nest assemblies 15 are carried between each of the fixed stations illustrated in FIG. 1.

Figure 6:
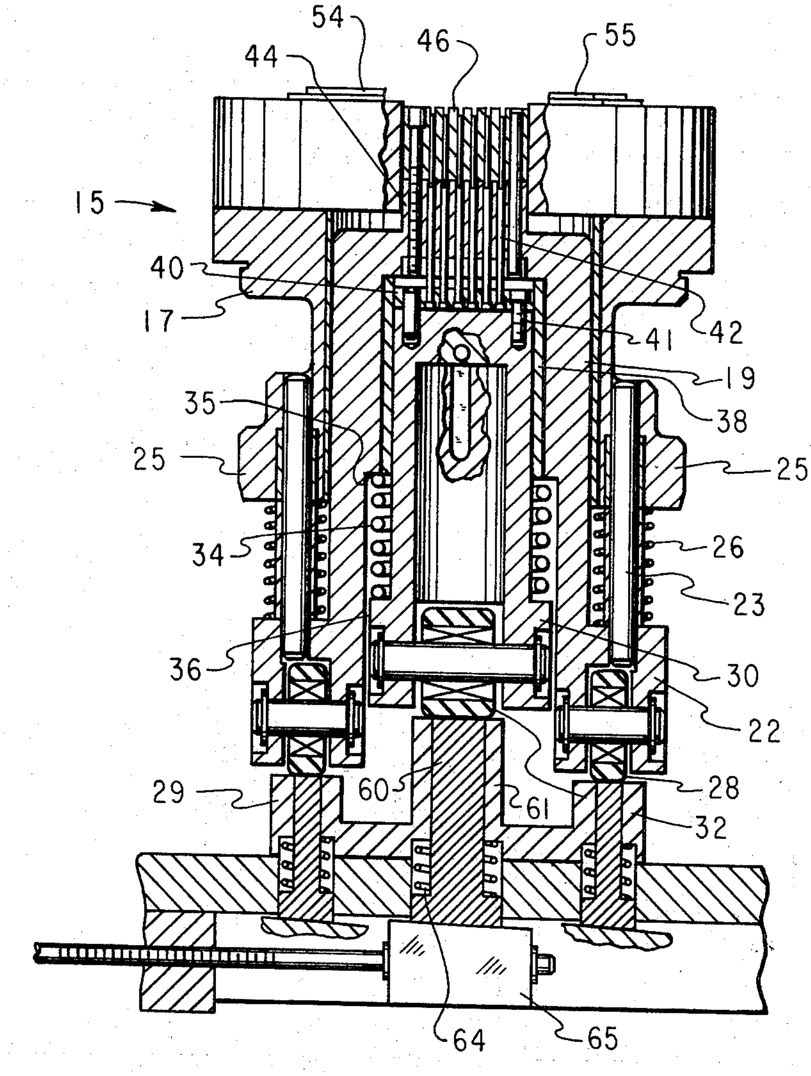
FIG. 6 is an enlarged cross sectional view on line 6—6 through the pinning station illustrating the details of the nest assembly, showing the nest assembly components in position after the pins are driven through the substrate.

Each nest assembly 15, as best seen in FIG. 6, comprises a nest housing 17 which is fixedly secured to the dial 12 by means of circumferentially spaced hold down clamps 18 as shown in FIG. 1. Mounted for reciprocation with the nest housing 17 is a nest supporting punch plunger guide 19, which is contoured as illustrated in FIG. 6, with a lower flange 22. Guide pins 23 extend between punch plunger guide flange 22 and flange 25 on the nest housing. Compression spring 26 is arranged between the flanges 22 and 25 surrounding guide pin 23 to exert a downward bias on punch plunger guide 19 with respect to the nest housing 17. Cam follower rollers 28 are arranged within flange 22 to move over the surface actuating cam assembly 29, so that depending on the contouring of the cam assembly surface, (which may be made adjustable as hereinafter described), and the movement thereof, the punch plunger guide 19 will be reciprocated within nest housing 17 against the biasing action of springs 26.

Mounted for reciprocation with the punch plunger guide 19 is the punch plunger 30, preferably formed of a hardened tool steel, and dimensioned to fit within the punch plunger guide 19 as best seen in FIG. 6. A cam follower roll 32 is mounted for rotation at the bottom of the punch plunger 30, and coil spring 34 is arranged about the punch plunger 30, bearing at one end on shoulder 35 formed within punch plunger guide 19, and on flange 36 of the punch plunger 30, so that the spring exerts a downward force on the punch plunger 30 with respect to the punch plunger guide 19, urging plunger cam follower 32 against the surface of cam assembly 29. The upper end of punch plunger 30 rides within bearing sleeve 38 secured in plunger guide 19.

Secured to the upper end of the punch plunger 30 is plunger plate 40 held by machine screws 41 to the top of the punch plunger 30. Punch plate 40 carries a plurality of pin punches 42 which ride in the punch pin guide plate 44 at the upper end of plunger guide 19. As will be understood by those skilled in the art, and as illustrated in FIG. 6, the number of punch pins 42, and the layout pattern of these pins is selected in accordance with the desired number of pins and their layout as required to provide the desired pin pattern in the substrate.

The punch pin guide plate 44, secured to (or formed integrally with) plunger guide 19, is formed with a number of openings corresponding to the number of pins, and the dimensioning of the punch guide plate openings is such as to permit the pin punches 42 to move freely without deflection as the plunger 30 reciprocates. Pin orienting nest plate 46 is secured above punch plate 44, on punch guide 19, and is provided with punch guide openings dimensioned to accommodate stepped down portions of the punches 42. This stepped arrangement of the punches 42 permits an increase in their strength, and minimizes bending and breaking of the punch in operation.

Figure 7:
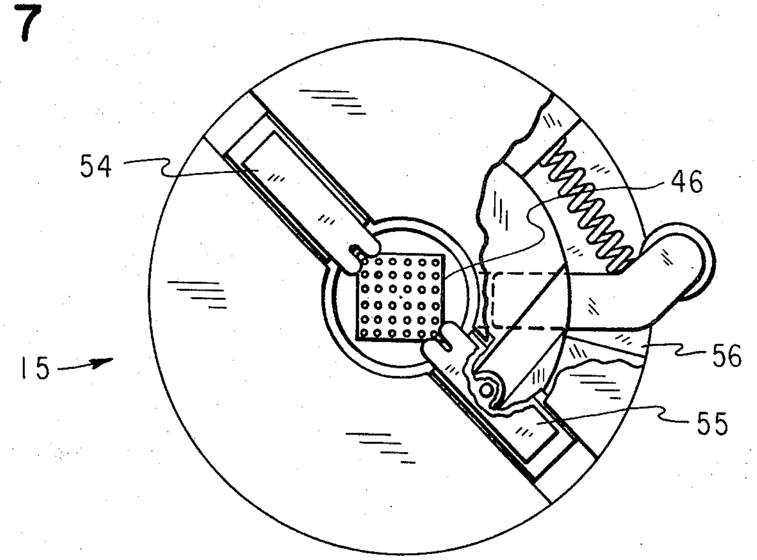
FIG. 7 is a top plan view of the nest assembly shown in FIG. 6 illustrating the substrate gripper plates.

Secured to the top of the nest housing 17 for movement over pin nest plate 46 is a gripper assembly as best seen in FIG. 7 comprising two opposed slidably mounted V-notched gripper plates 54 and 55. The V-notched gripper plates are mounted for cam actuation by ring cam linkage 56 to move to and from each other, with the V notch dimensioned to securely engage opposed corners of a square substrate. As described below, the gripper plates 54 and 55 are moved to a substrate gripping position after station 2 to grip the positioned substrate, and separated slightly at stations 4 and 5, and released at station 6.

A nest assembly 15 as above described is arranged at each of the six stations of the index unit as illustrated in FIG. 1, and the cam assembly 29 is provided with cammed surfaces to orient the nest assembly components to the positions required at the different stations as will be hereinafter described, as the dial 12 is rotated.

The cam assembly 29 is formed with a plurality of adjustable spring pressed plungers to facilitate adjustment of the camming action, and to prevent locking of the mechanism. Thus punch plunger cam follower roll 32 rides over a cam plunger 60 mounted in cam assembly sleeve 61. The plunger 60 is spring biased by spring 64 downwardly against adjusting wedge 65. Adjustment of the height of the cam surface is obtained by moving wedge 65.

Figure 9:
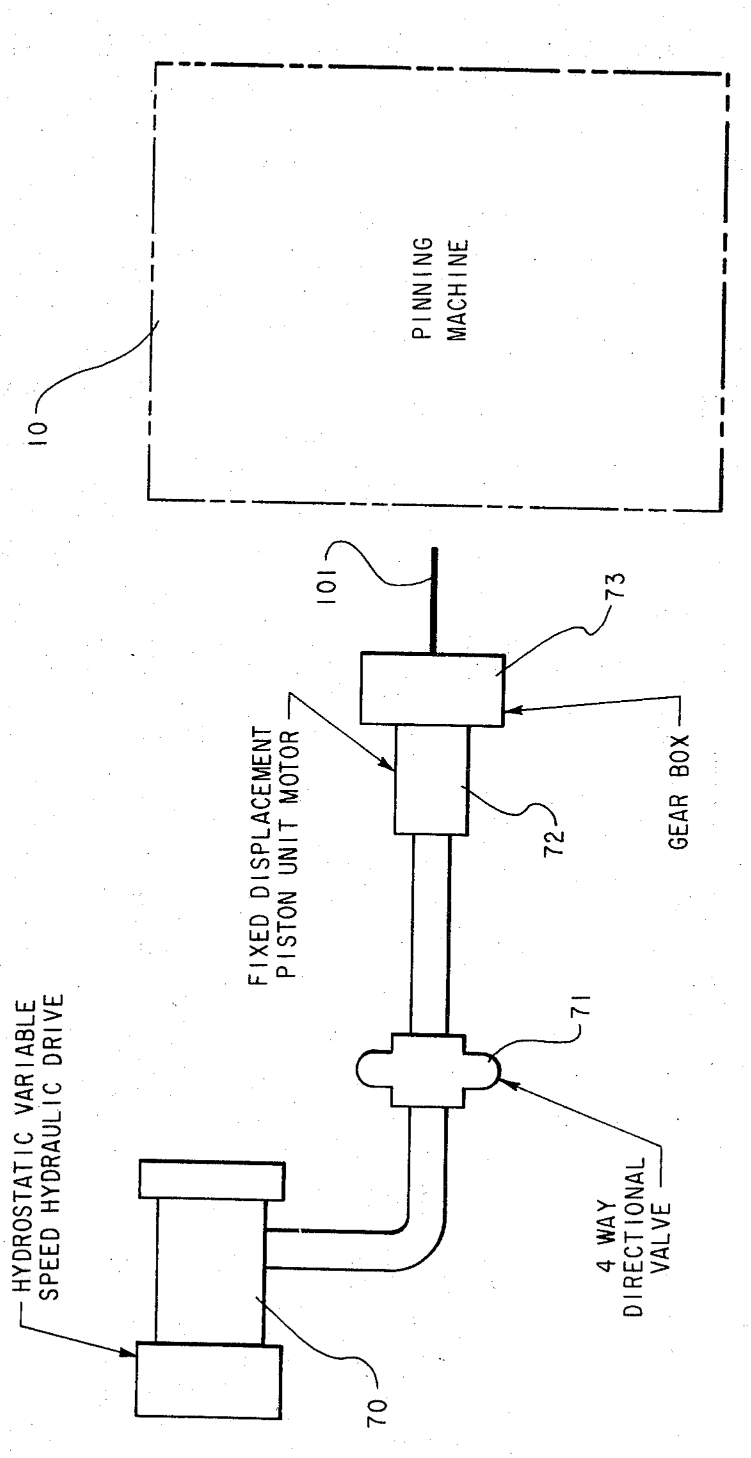
FIG. 9 is a schematic block diagram of the hydraulic drive system employed.

Though it will be understood that a variety of different drive mechanisms may be employed, according to the illustrated preferred embodiment of the invention, a hydraulic drive as schematically shown in FIG. 9 is employed utilizing a hydrostatic variable speed drive 70 the output of which is coupled via a 4-way directional valve 71 to a fixed displacement piston unit motor 72 connected via gear box 73 to the pinning machine.

METHOD

Though a variety of apparatus may be employed to implement the practice of the method of substrate pinning here disclosed, the instant apparatus serves to facilitate the pinning of a substrate in accordance with the method as here described.

Thus a plurality of pins are oriented in an array corresponding to that which the pins will have in the substrate after pinning. The substrate formed with openings for receipt of the pins is then positioned over the oriented array of pins, with the openings in the substrate aligned with the pins and gripped in this aligned position. Thereafter the substrate is inspected to insure the fact that there is a pin aligned with each substrate opening. According to the invention, it is desired that the entry ends of the pins be free of lateral restraint during the approach of the pins to the substrate so that minor pin misalignements may be accommodated without breaking the substrate. The pins are then moved into the substrate openings and through the substrate with the upper ends of the pins extending above the substate, and the lower surface of the substrate is engaged. At this time a compressive force is exerted on these exposed upper ends of the pins to deform them and form the desired heads at the upper end of the substrate. The lower surface of the substrate is then released and the bearing surface previously holding this lower surface of the substrate is maintained at a spaced distance from the substrate, while at the same time a force is exerted on the upper ends of the pins which have already been headed, asas a result of which a bulge will be formed between this bearing surface and the lower surface of the substrate. The headed and bulged pinned substrate is then ready for subsequent use.

APPARATUS OPERATION

Pin Positioning

At station 1, as shown in FIG. 1, a pin shuttling mechanism 80 is provided, which carries pins fed from a vibrating bowl into a track which directs the aligned rows of pins into a plurality of spaced tubes oriented in alignment with the openings in pin receiving nest plate 46, so that a pin will be fed into each of the nest plate openings at station 1. At this station 1, the nest assembly components are oriented so that the punch guide maintains the top of the plate 46 at a position substantially flush with the top of the dial. The punch plunger 30 is in a lower position, such that the pins may be substantially enclosed in the pin nest plate 46.

Substrate Feed

Figure 4:
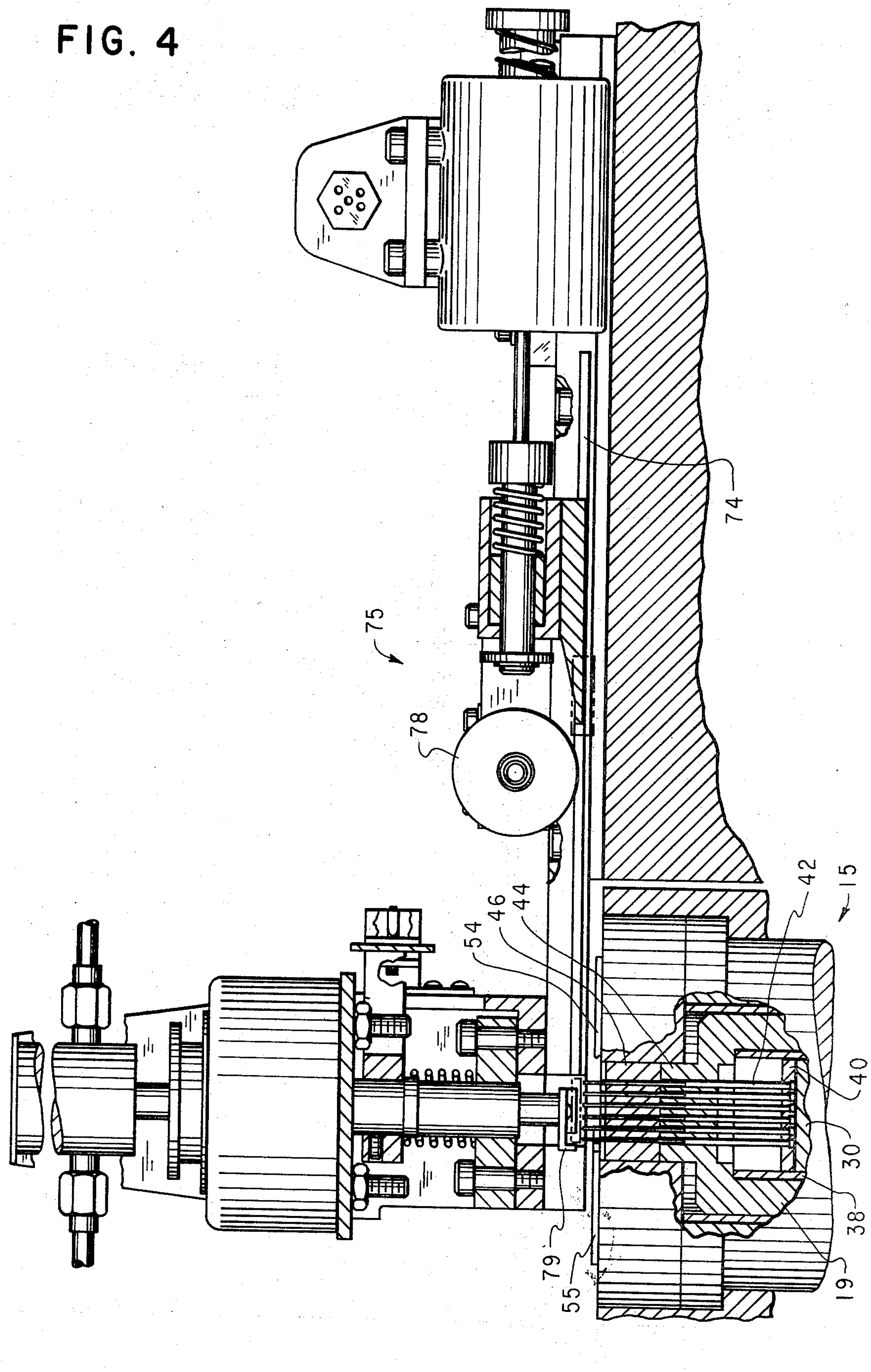
FIG. 4 is a cross sectional view taken on line 4—4 of FIG. 1, illustrating the substrate feeding station, with parts of the nest assembly broken away to reveal the position of the nest assembly components as the substrate is positioned for pinning.

After the pins are positioned in the pin nest plate 46 at station 1, the dial 12 is moved to rotate the pin filled nest to substrate positioning station 2 as illustrated in FIGS. 1 and 4.

At station 2, the substrates formed with pin receiving openings in which the pins are to be applied are fed to a position above the nest by substrate feed mechanism 75, as best seen in FIG. 4 in which the substrates are fed along conveyor belt 76 from which they are discharged on to trackway 77 in an aligned row. Feed roll 78 over trackway 77 moves the row of substrates so that the leading substrate under plunger 79 may be positively positioned on the pin filled nest.

At station 2, the nest assembly components are oriented so that the grippers 54 and 55 are out, that is separated in a non-substrate engaging position, with the punch guide and punch in the up position described at station 1.

Inspection

The dial is then rotated, and as it is rotated to move the nest to the inspection station 3, the substrate grippers 54 and 55 move inwardly to engage the substrate. The nest assembly components assume the orientation illustrated in FIG. 6, with the punch guide 19 lowered along with the pin nest to provide a clearance below the surface of the substrate, which is now securely held by the grippers 54 and 55. Though the pin nest 46 is lowered, the punch plunger 30 and punches 42 are maintained in the same position they had in FIG. 4 at stations 1 and 2 so that the leading ends of the pins now protrude from the nest and are laterally unrestrained adjacent the bottom of the substrate, the tip of each pin immediately adjacent the lower end of a pin opening in the substrate. At station 3, either visually, or optically, a view of the top of the substrate is provided, and any light passing through the substrate openings indicates that a pin is not properly positioned for insertion into the substrate, at which time the matter may be corrected. It should be noted that satisfactory operation may be obtained by raising the punch plunger 30 slightly as the nest assembly is shifted to inspection station 3 to partially insert the pins into the substrate. The clearance between the pin receiving nest plate 46 at the top of the nest assembly, and the bottom of the substrate which is preferably 0.100 inch will provide sufficient clearance so that light may pass through any openings in the substrate not filled by a pin, and to accommodate any misalignemnt of the pins without damage to the substrate.

HEADING

Figure 2:
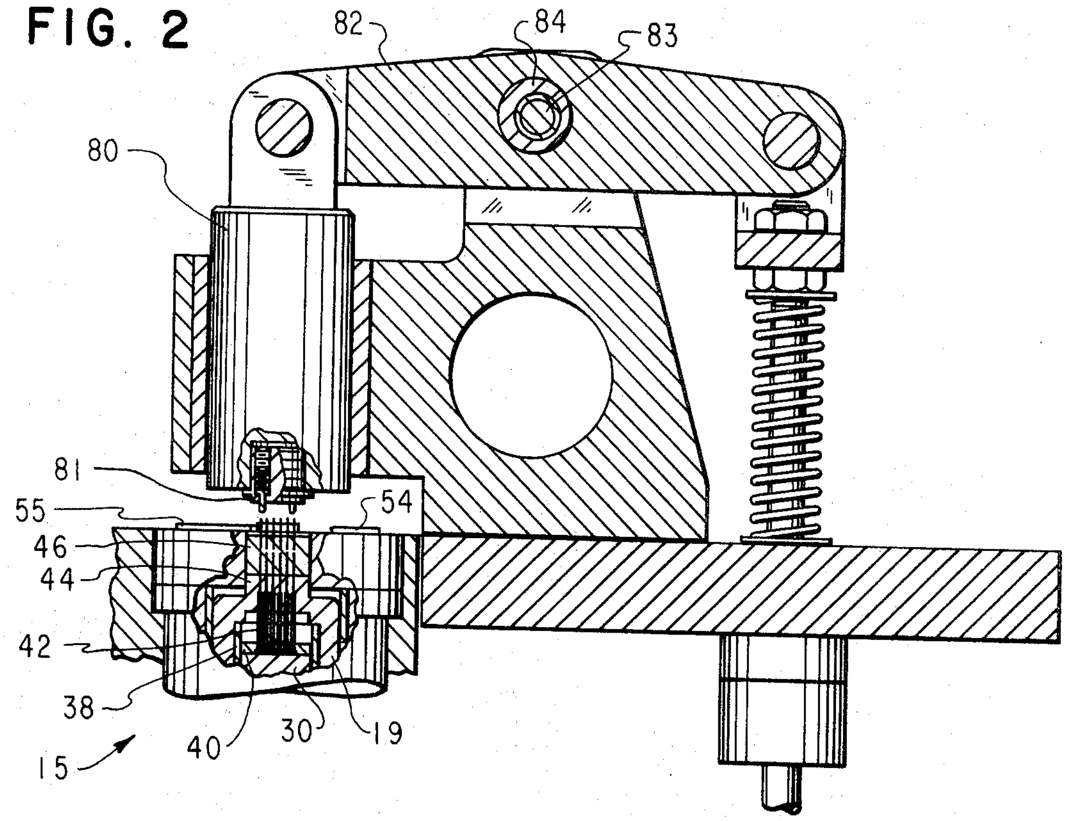
FIG. 2 is a cross sectional view on line 2—2 of FIG. 1 illustrating the leading station, with parts broken away through the nest assembly to show the relative position of the nest assembly components immediately prior to heading of the pins in the substrate.

On its way to heading station 4 as illustrated in FIGS. 1 and 2, the punch guide 30 and the pin nest plate 46 at the top thereof are raised to bring the top of the pin nest plate 46 beneath the substrate to support the bottom thereof. Punch plunger 30 is raised to bring the pin punches 42 up to force the pins through the substrate with a portion of the pins extending above the top of the substrate. Then it is preferred that grippers 54 and 55 be slightly separated to release the substrate to avoid chipping the edges of the substrate during the heading operation. At station 4, as best seen in FIG. 2, the ram 80 illustratively shown as formed with ram head 81 is brought down onto the exposed ends of the pins to upset same to form the desired pin heads.

The ram 80 is as illustratively shown preferably formed with ram lever 82 pivoted at 83 on a pivot journalled in an eccentric bushing 84 so that upon rotation of bushing 84 the lever arm will be changed to permit adjustment of the stroke of ram head 81. Ram head 81 is formed as shown in FIG. 2 with three nested spring loaded plungers which facilitate the seating of the substrate on the pin nest plate 46.

The dial is then stepped or indexed to move the nest from the heading station 4 to the bulging station 5, as best seen in FIG. 1.

BULGING

Figure 3:
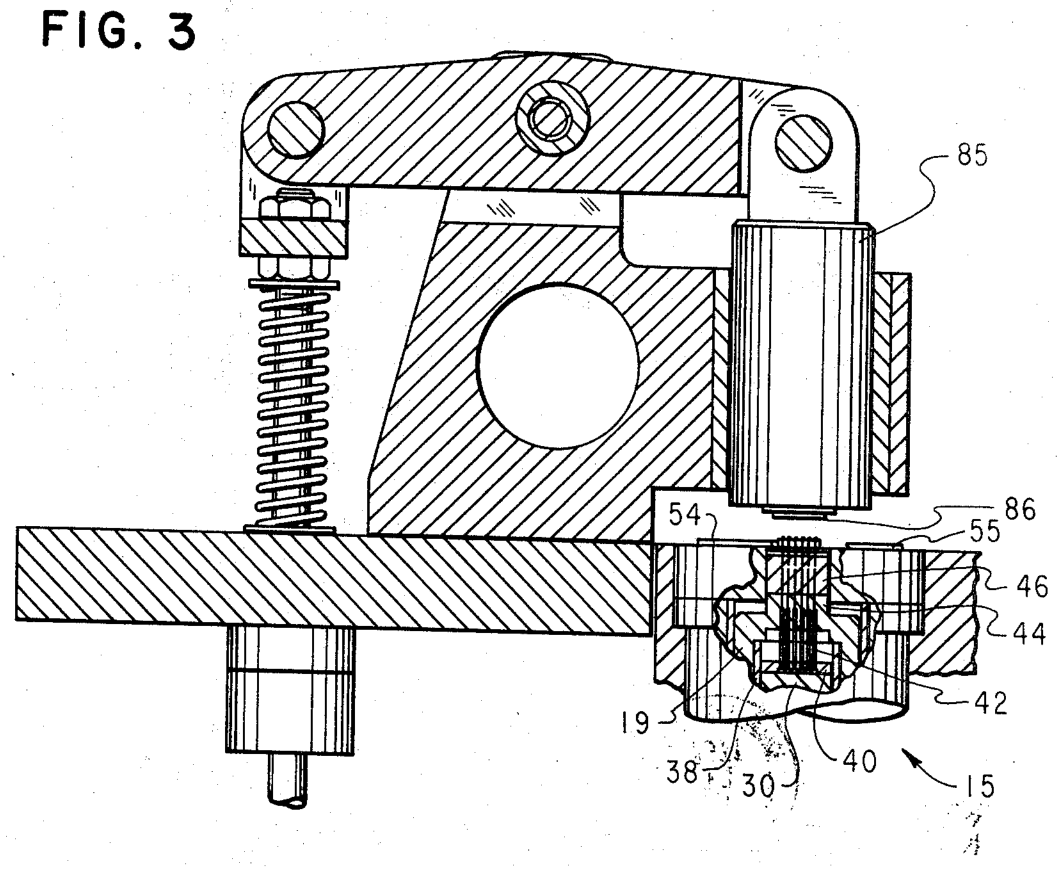
FIG. 3 is a cross sectional view on line 3—3 at the bulging station, with parts of the nest assembly broken away to illustrate the relative position of the nest assembly components immediately prior to the bulging operation.

On the way to bulging station 5, from heading station 4, the nest assembly components are moved to the position shown in FIG. 3, so that thz punch guide 19 is lowered to bring the top of the pin nest plate 46 down from the bottom of the substrate a distance sufficient to accommodate the desired bulge dimension leaving a portion of the pins between the bottom of the substrate and the nest plate laterally unrestrained. The punch plunger 30 maintains its position retaining the pin punches 42 against the bottom ends of the headed pins in nest plate 46, and the grippers 54 and 55 are maintained in their slightly separated orientation.

At the bulging station 5, the ram 85, having ram head 86, is brought down to impact the pin, which deforms along the laterally unrestrained portions of the pins, namely beneath the substrate, and above the nest plate 46 at the top of the nest.

There is minimal stress on the substrate since the heading operation has already upset the pin portion in the substrate Which is thus strain hardened, and all of the pin deformation stresses which would tend to damage the substrate are taken up by the pin portion beneath the substrate.

EJECTION

Figure 5:
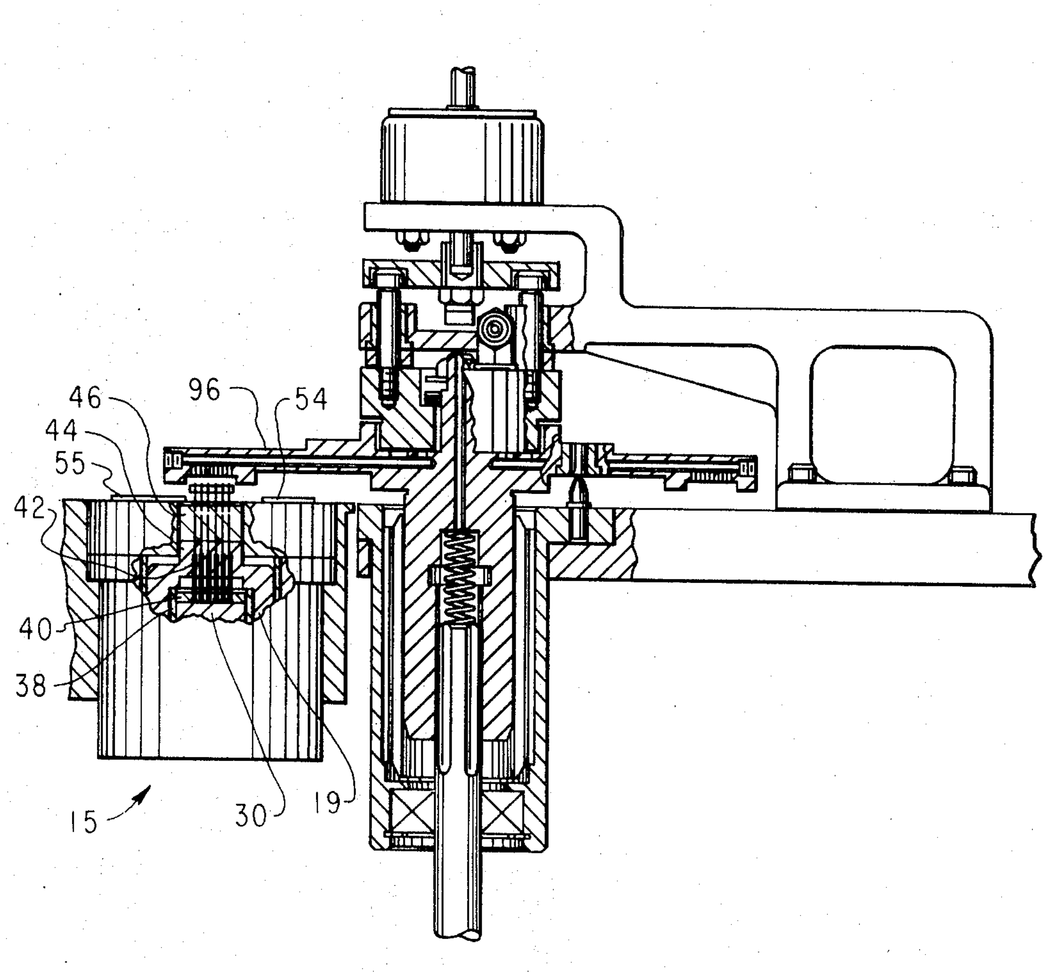
FIG. 5 is a cross sectional view taken on line 5—5 showing the ejection station, with parts of the nest assembly broken away to illustrate the orientation of the nest assembly components as the pinned substrate is removed from the pinning equipment.

The dial is then rotated to bring the nest assembly from the bulging station 5 to ejection station 6. At ejection station 6, as best seen in FIGS. 1 and 5, the punch plunger 30 is raised moving punches 42 against the pins to release them from the nest plate 46, and the gripper plates 54 and 55 are separated so that the substrate is raised above the dial.

A substrate removal assembly 95, having rotatable vacuum arms 96 is positioned at station 6, so that one of the vacuum arms 96 will engage the pinned substrate, and upon rotation of the arm 96 which has engaged the pinned substrate to a position overlying endless conveyor 98, the arm over conveyor 98 has its vacuum release so as to drop the engaged substrate onto the conveyor belt for removal to a collection station.

CONTROL SYSTEM

Figure 8:
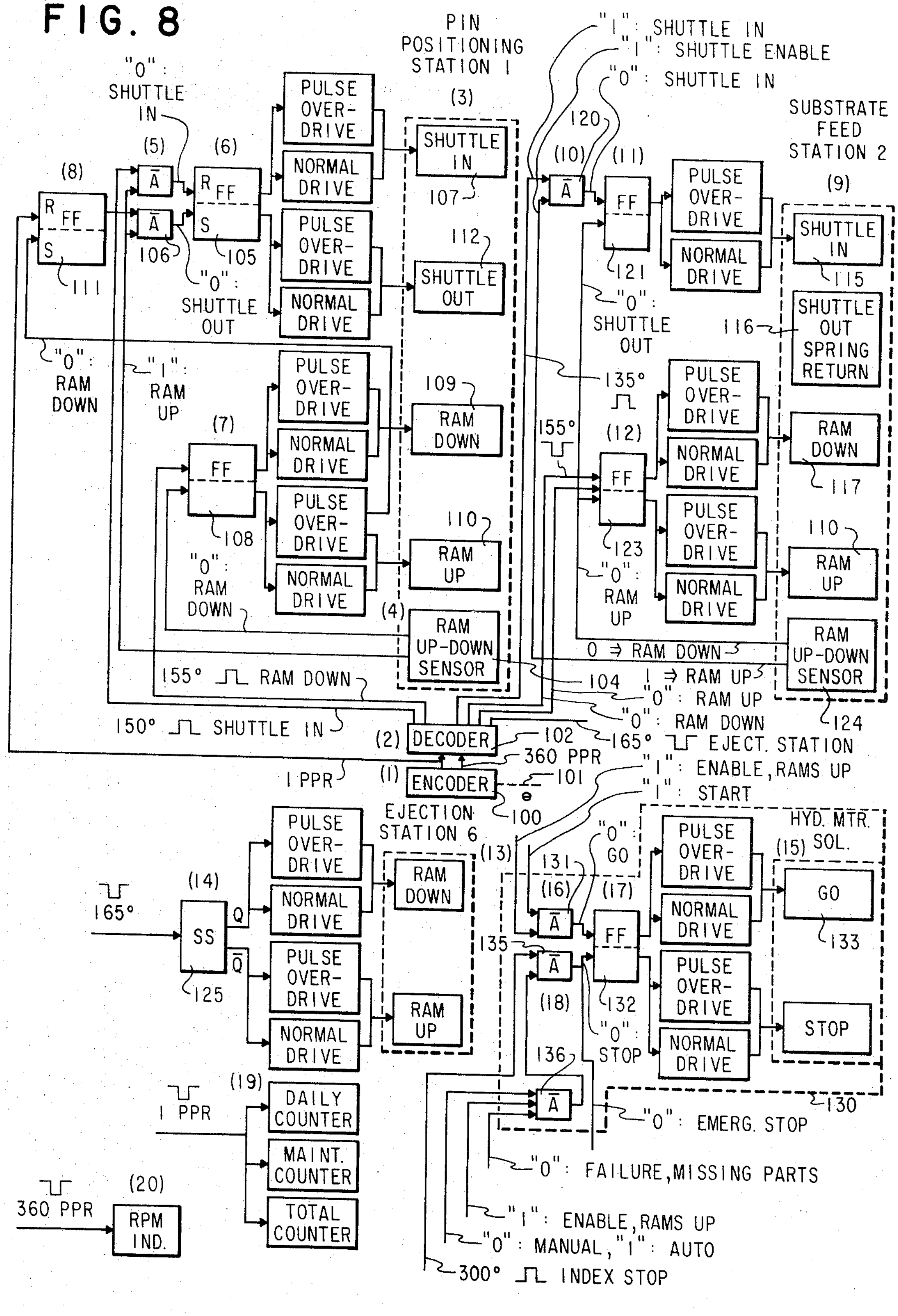
FIG. 8 is a schematic block diagram illustrating the control system for the apparatus.

A suggested control system for obtaining the above described sequence of apparatus operation is illustratively shown in FIG. 8, wherein the timing sequence for actuating the apparatus components at the different stations is controlled by encoder 100 which is coupled to the input shaft 101 from the drive illustrated in FIG. 9. The encoder delivers output pulses in two separate channels. A main channel carries 360 pulses per revolution of the input shaft 101, while a reset channel carries one pulse per revolution. The reset pulse sets a register in the decoder 102, and the main channel pulse drives a counter in the decoder. The output of the decoder provides actuating signals for the different stations of the apparatus.

At the pin positioning station 1 (see FIG. 1) four air valve solenoids are employed to effect shuttle operation (as identified in the dash-line enclosed area on FIG. 8). In addition photo sensors 104 are employed to sense ram position. A pulse is sent from the decoder 102 to flip-flop 105 via gating circuit 106. If the ram is up as sensed by sensor 104, flip-flop 105 is set to energize the shuttle-in solenoid 107. The decoder 102 then sends a pulse to flip-flop 108 (after approximately 5° of shaft rotation) energizing ram-down solenoid 109. When the ram is down, sensor 104 sends a signal to flip-flop 108 which energizes ram-up solenoid 110. Simultaneously, a pulse is sent to the shuttle return flip-flop 111 which is gated with the ram-up signal to trigger shuttle-out solenoid 112 via flip-flop 105. As is apparent to those skilled in the art, the air valve solenoids operate in push-pull fashion, only one solenoid for each direction of movement being energized at a time.

When the nest assembly is moved to the substrate positioning station 2, as can be seen from the drawing, a shuttle-in solenoid valve 115 is employed like pin positioning shuttle-in valve 107. However, shuttle-out valve 112 is replaced by a return spring 116. As previously described for the pinning station, but at a different angle of shaft rotation, as is apparent, the decoder transmits a pulse to the shuttle gating network 120. If the ram is up, shuttle flip-flop 121 transmits a signal energizing shuttle solenoid 115. Thereafter a pulse from the decoder is sent through ram flip-flop 123 to energize ram-down solenoid 117. When the ram is down, the ram sensor 124 transmits a return signal to flip-flops 121 and 123.

When the dial is rotated to bring the nest assembly to the ejection station 6, a single shot 125 is energized to drive the ram down and return. Two alternatively driven air valve solenoids are also energized by the single shot 125.

Motor control circuit 130 permits initiation of machine operation by a start switch coupled to motor gating circuit 131. If the rams are up, a signal from gating circuit 131 sets motor flip-flop 132 in the Run mode energizing Go solenoid 133. If the machine is in the single cycle mode, an ecoder pulse at 300° will stop the machine by a signal from stop-gate network 135. Connected to this stop-gate network 135 are also failure networks 136 responding to signals indicating other no-go conditions such as parts missing or the like.

While the invention has been shown and described with reference to a preferred embodiment thereof, it will be understood by those skilled in the art that changes in form and detail may be made without departing from the spirit and scope of the invention.

What is claimed is:

1. Means for applying conducting pins to a substrate formed with a plurality of spaced apertures for receipt of the pins, said means comprising:

pin supporting means, said pin supporting means comprising a nest assembly for use in inserting pins into a substrate, said nest assembly comprising:

a nest housing having an upper surface;

a pin receiving nest reciprocably mounted in said housing and having a plurality of pin receiving openings extending through said nest;

a punch assembly reciprocably mounted beneath said nest in said housing, said punch assembly having a plurality of pin punches extending into the pin receiving nest openings, and reciprocable therein;

substrate gripping means engaging and gripping the substrate at a fixed position with respect to said pin supporting means, said substrate gripping means comprising substate grippers mounted to move over the upper surface of said nest housing to engage a substrate in position over said pin receiving nest;

pin moving means engaging said pin to move an entry end of a supported pin into an aperture of said substrate;

heading means engaging the end of the pin inserted through the substrate to apply pressure thereto to upset the pin to form a head thereon; and bulging means exerting a pressure on said pin to upset the pin on the side of the substrate opposite to the headed end of said pin.

2. Means as in claim 1 in which said pin supporting means maintains a plurality of pins in a spaced array corresponding to the spacing of the apertures in the substrate.

3. Means as in claim 1 in which said pin supporting means are positioned to engage said substrate after said pin moving means move the entry end of the pin into the substrate.

4. Means as in claim 3 in which said pin, moving means move said pin toward said substrate from said pin supporting means with the entry end of said pin laterally unrestrained as it approaches said substrate.

5. Means as in claim 3 in which said pin supporting means are moved to a position spaced from the substrate after said pins are headed and prior to presenting said pins to said bulging means.

6. Means as in claim 1 in which said pin receiving nest is formed with a punch guide beneath said nest.

7. Means as in claim 6 in which said pin punches are of a stepped configuration with a portion of said punches engaging said pins relatively thinner than a portion of the pin punches remote from the pins and moving in said punch guide.

8. Means as in claim 1 in which said housing is formed with a bore in which said nest may be moved.

9. Means as in claim 6 in which said pin receiving nest is supported on a punch plunger guide having a bearing surface; and a punch plunger reciprocably mounted to move over said bearing surface.

10. Means as in claim 1 in which spring means bias said pin receiving nest away from the upper surface of said housing; and spring means bias said punch assembly away from the upper surface of said housing.

11. Means as in claim 1 mounted in a dial for stepped movement between a pin receiving station, a substrate positioning station, a pinning station, a heading station, and a bulging station.

12. Means as in claim 11 in which said dial moves said nest assembly past an inspection station after said substrate positioning station; and to an ejection station after said bulging station.

13. Means as in claim 11 in which a cam assembly is arranged beneath said dial having a cam surface engaging a cam follower on said pin receiving nest, and a cam surface engaging a cam follower on said punch assembly to effect relative movement between said nest and punch assembly.

14. Means as in claim 13 in which said cam assembly comprises: a cam plunger engaging the cam follower; a plunger stem; and a wedge member engaging said plunger permitting relative adjustment between said plunger and said cam follower.

15. Means as in claim 14 in which said cam assembly comprises: a spring biasing said plunger downwardly; said plunger being baised downwardly against said wedge member by said spring; and means for moving said wedge member to adjust the position of said plunger.

* * * * *